(12) United States Patent
Ahn et al.

(10) Patent No.: US 10,634,634 B2
(45) Date of Patent: Apr. 28, 2020

(54) MICRO SENSOR PACKAGE AND MANUFACTURING METHOD OF MICRO SENSOR PACKAGE

(71) Applicant: POINT ENGINEERING CO., LTD., Asan (KR)

(72) Inventors: Bum Mo Ahn, Suwon (KR); Seung Ho Park, Hwaseong (KR); Sung Hyun Byun, Hwaseong (KR)

(73) Assignee: POINT ENGINEERING CO., LTD., Asan (KR)

( * ) Notice: Subject to any disclaimer, the term of this patent is extended or adjusted under 35 U.S.C. 154(b) by 283 days.

(21) Appl. No.: 15/702,673

(22) Filed: Sep. 12, 2017

(65) Prior Publication Data

US 2018/0073999 A1    Mar. 15, 2018

(30) Foreign Application Priority Data

Sep. 13, 2016  (KR) .................. 10-2016-0118099

(51) Int. Cl.
| | |
|---|---|
| *G01N 27/12* | (2006.01) |
| *B01L 3/00* | (2006.01) |
| *H05K 3/46* | (2006.01) |
| *H05K 1/14* | (2006.01) |
| *H05K 1/18* | (2006.01) |
| *H05K 3/32* | (2006.01) |
| *H05K 3/36* | (2006.01) |

(52) U.S. Cl.
CPC ...... *G01N 27/128* (2013.01); *B01L 3/502707* (2013.01); *B01L 3/502715* (2013.01); *H05K 1/145* (2013.01); *H05K 1/183* (2013.01); *H05K 3/32* (2013.01); *H05K 3/462* (2013.01); *B01L 2200/10* (2013.01); *B01L 2200/12* (2013.01); *B01L 2300/0645* (2013.01); *B01L 2300/123* (2013.01); *B01L 2300/161* (2013.01); *H01L 2224/18* (2013.01); *H01L 2924/15153* (2013.01); *H05K 3/368* (2013.01); *H05K 2201/10151* (2013.01)

(58) Field of Classification Search
CPC ................................. G01N 27/12; B01L 3/00
USPC ...................................................... 422/90, 98
See application file for complete search history.

(56) References Cited

U.S. PATENT DOCUMENTS

| | | | |
|---|---|---|---|
| 6,885,107 B2 * | 4/2005 | Kinsman | H01L 27/14618 257/421 |
| 7,373,835 B2 * | 5/2008 | Matsubara | B81B 7/0006 73/756 |
| 8,815,065 B2 * | 8/2014 | Yamamoto | G01N 27/4072 204/415 |
| 2008/0164543 A1 | 7/2008 | Ziglioli et al. | |
| 2014/0283632 A1 * | 9/2014 | Fix | G01D 11/30 73/866.5 |

(Continued)

FOREIGN PATENT DOCUMENTS

| | | |
|---|---|---|
| CN | 104515793 A | 4/2015 |
| EP | 0364173 A1 | 4/1990 |

(Continued)

*Primary Examiner* — Arlen Soderquist

(57) ABSTRACT

Disclosed is a microsensor package. Particularly, disclosed is a microsensor package, in which a sensing chip is packaged by using PCBs stacked on top of one another, whereby the thickness of the package slim can be kept slim, and at the same time, it can be manufactured at a low cost and can be easily manufactured.

13 Claims, 6 Drawing Sheets

(56) References Cited

U.S. PATENT DOCUMENTS

| | | | |
|---|---|---|---|
| 2015/0075258 A1* | 3/2015 | Paik | G01N 27/041 |
| | | | 73/31.06 |
| 2015/0177171 A1* | 6/2015 | Kim | G01N 27/128 |
| | | | 73/31.05 |
| 2015/0198551 A1 | 7/2015 | Jun et al. | |
| 2016/0290946 A1* | 10/2016 | Montanya Silvestre | |
| | | | G01N 27/128 |
| 2017/0261455 A1* | 9/2017 | Paik | H01L 29/08 |
| 2017/0271278 A1* | 9/2017 | Liu | H01L 23/49582 |

FOREIGN PATENT DOCUMENTS

| | | | |
|---|---|---|---|
| EP | 2182497 | * | 5/2010 |
| EP | 2182497 B1 | | 11/2010 |
| JP | 2003-232693 | * | 8/2003 |
| JP | 2008-107105 A | | 5/2008 |
| JP | 2012-078089 A | | 4/2012 |
| JP | 2012-098233 A | | 5/2012 |
| JP | 2012-098234 A | | 5/2012 |
| KR | 20060044222 A | | 5/2006 |
| KR | 10-0652571 B1 | | 10/2006 |
| KR | 20160061842 A | | 6/2016 |
| KR | 10-2016-0087546 A | | 7/2016 |
| WO | 2009/145373 | * | 12/2009 |

\* cited by examiner

MICRO SENSOR PACKAGE AND MANUFACTURING METHOD OF MICRO SENSOR PACKAGE

CROSS REFERENCE TO RELATED APPLICATION

The present application claims priority to Korean Patent Application No. 10-2016-0118099, filed Sep. 13, 2016, the entire contents of which is incorporated herein for all purposes by this reference.

BACKGROUND OF THE INVENTION

Field of the Invention

The present invention relates generally to a microsensor package. More particularly, the present invention relates to a microsensor package, in which a sensing chip is packaged by using PCBs stacked on top of one another.

Description of the Related Art

A conventional micro package for a gas sensor capable of sensing an amount of gas is shown in FIG. 1, which will be briefly described as follows.

A chip mounting portion 2 is formed at a predetermined depth in a central part of a body part 1 that is in the form of a quadrangular plate made of an insulating material, and a sensor chip 4 is attached to the bottom surface of the chip mounting portion 2 by using an epoxy 3.

A plurality of circuit lines 5 are formed inside the body part 1, and a stepped portion 6 having a predetermined height is formed on the inner side edge of the chip mounting portion 2 along the inner circumferential surface thereof.

The stepped portion 6 is formed with an inner terminal 5a extending from a first end of the circuit line 5, and the lower edge of the body 1 is formed with an outer terminal 5b extending from a second end of the circuit line.

The sensor chip 4 is formed with a sensing film 16 at the center of the upper surface thereof to sense gas, and is formed with a plurality of sensor-side terminals 11 at the edge thereof to transmit the resistance change sensed by the sensing film 16 to the outside, such that the sensor-side terminals 11 and the inner terminal 5a of the circuit line 5 are electrically connected to each other by a silver paste 12.

The cap 13 is attached to the upper portion of the body part 1 using an adhesive 14 to cover the chip mounting portion 2, and a plurality of gas holes 15 are formed in the cap 13 to allow gas to flow into the chip mounting portion 2.

The micro package for a gas sensor configured as described above detects an amount of gas as follows. When gas flows into the chip mounting portion 2 through the gas holes 15 of the cap 13, a resistance value of the sensing film 16 formed on the upper surface of the sensor chip 4 is changed by the introduced gas, and the resistance value is transmitted to a control unit (not shown) through the circuit line 5, thereby detecting the amount of gas.

However, the conventional micro package for a gas sensor is problematic in that the height of the silver paste that electrically connects the terminals increases the overall height of the package, which limits the production of a light, slim, and compact micro package that can be mounted to a small electronic device.

The conventional micro package is further problematic in that since it is necessary to perform a connection operation for electrically connecting the terminals to each other, there is a limit in reducing the number of manufacturing steps, whereby there is a limit in reducing manufacturing cost.

To solve this problem, Korean Patent No. 652571 discloses a micro package configured such that a body part is formed with a chip mounting portion with a gas hole communicating with the chip mounting portion, and a circuit line is formed inside the body part, but it is problematic in that since an inner terminal connected to the circuit line at a right angle is required to be formed inside the body part, it is difficult to manufacture.

The foregoing is intended merely to aid in the understanding of the background of the present invention, and is not intended to mean that the present invention falls within the purview of the related art that is already known to those skilled in the art.

DOCUMENTS OF RELATED ART (Patent Document 1) Korean Patent No. 652571;
(Patent Document 2) Japanese Patent No. 5403695;
(Patent Document 3) Japanese Patent No. 5595230; and
(Patent Document 4) Japanese Patent No. 5483443.

SUMMARY OF THE INVENTION

Accordingly, the present invention has been made keeping in mind the above problems occurring in the related art, and an object of the present invention is to provide a microsensor package, in which a sensing chip is packaged by using PCBs stacked on top of one another, whereby the thickness of the package slim can be kept slim, and at the same time, it can be manufactured at a low cost and can be easily manufactured.

In order to accomplish the above object, the present invention provides a microsensor package including: a sensing chip; a first PCB provided with a first electrode layer patterned on a lower surface thereof, and provided with a first space having an open top; and a second PCB disposed at an upper portion of the first PCB, provided with a second electrode layer patterned on a lower surface thereof, and provided with a second space penetrating vertically therethrough to stepwise communicate with the first space, wherein the first electrode layer and the second electrode layer are electrically connected to each other, and the sensing chip is disposed in the first space and is electrically connected to the second electrode layer.

The first PCB and the second PCB may be attached to each other by an adhesive layer.

An upper portion of the second space may be covered with an AAO filter.

The AAO filter may be subjected to hydrophobic surface treatment.

The first PCB may be provided with a third space penetrating vertically therethrough, and the third space may be provided therein with a connecting portion electrically connecting the first electrode layer and the second electrode layer to each other.

The third space may be configured to be open at an outer side thereof.

The second PCB may be in a form of a flexible PCB.

The sensing chip and the second electrode layer may be electrically connected to each other via an Ag epoxy or a solder.

The first space may penetrate vertically through the first PCB.

In order to accomplish the above object, the present invention further provides a manufacturing method for a microsensor package, which includes: preparing a first PCB provided with a first electrode layer patterned on a lower surface thereof and a first space penetrating vertically therethrough, and a second PCB provided with a second electrode layer patterned on a lower surface thereof and a second space penetrating vertically therethrough; bonding the second PCB to an upper portion of the first PCB such that the first space and the second space stepwise communicate with each other; and electrically connecting the sensing chip to the second electrode layer after disposing the sensing chip in the first space.

The manufacturing method may further include connecting the first electrode layer and the second electrode layer to each other after the bonding the second PCB.

In the electrically connecting the sensing chip, the first PCB may be provided with a third space penetrating vertically therethrough, and the third space may be provided therein with a connecting portion connecting the first electrode layer and the second electrode layer to each other.

The third space may penetrate through both the first PCB and the second PCB; in the electrically connecting the sensing chip, the connecting portion may be provided along an inner wall of the third space to be formed in a hollow columnar shape; the first space may be provided in the first PCB in plural; the second space may be provided in the second PCB in plural; the sensing chip may be connected to the second PCB in plural; the third space may be disposed between neighboring sensing chips; and the manufacturing method may further include separating the first PCB and the second PCB along the third space after the electrically connecting the sensing chip.

According to the microsensor package of the present invention as described above, effects as follows may be obtained.

Since the sensing chip is packaged by using PCBs stacked on top of one another, the thickness of the package may be kept slim, and at the same time, it may be manufactured at a low cost and may be easily manufactured.

Since the first space is formed vertically through the first PCB, and the sensing chip is connected to the second PCB by inserting the sensing chip through the first space after bonding the first PCB and the second PCB, the manufacturing process may be simplified.

Since the upper portion of the second space is covered by the AAO filter, it is possible to effectively prevent foreign matter from being introduced into the gas sensing portion.

Since the AAO filter is subjected to hydrophobic surface treatment, it is possible to prevent moisture penetration into the gas sensing portion.

Since the third space is formed vertically through the first PCB and the second PCB, and the connecting portion electrically connecting the first electrode layer and the second electrode layer is formed in the third space, it is possible to connect the first electrode layer and the second electrode layer to each other through a simple process.

Since the second PCB is a flexible PCB, it is possible to reduce the thickness of the package.

Since the sensing chip and the second electrode layer are connected to each other via an Ag epoxy or a solder, it is possible to prevent a bonding material bonding the sensing chip and the second electrode layer from being remelted when bonding the microsensor package to the associated PCB, thereby preventing separation, and it is possible to secure excellent conductivity.

Since the connecting portion is provided along the inner wall of the third space to be formed in a hollow columnar shape, it is possible to simultaneously manufacture a plurality of unit packages by a simple breaking or a cutting process, and in the cutting process, when cutting is performed along the third space, the connecting portion of two unit packages may be formed in a single process, and the cutting may be done quickly.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Figure 1:
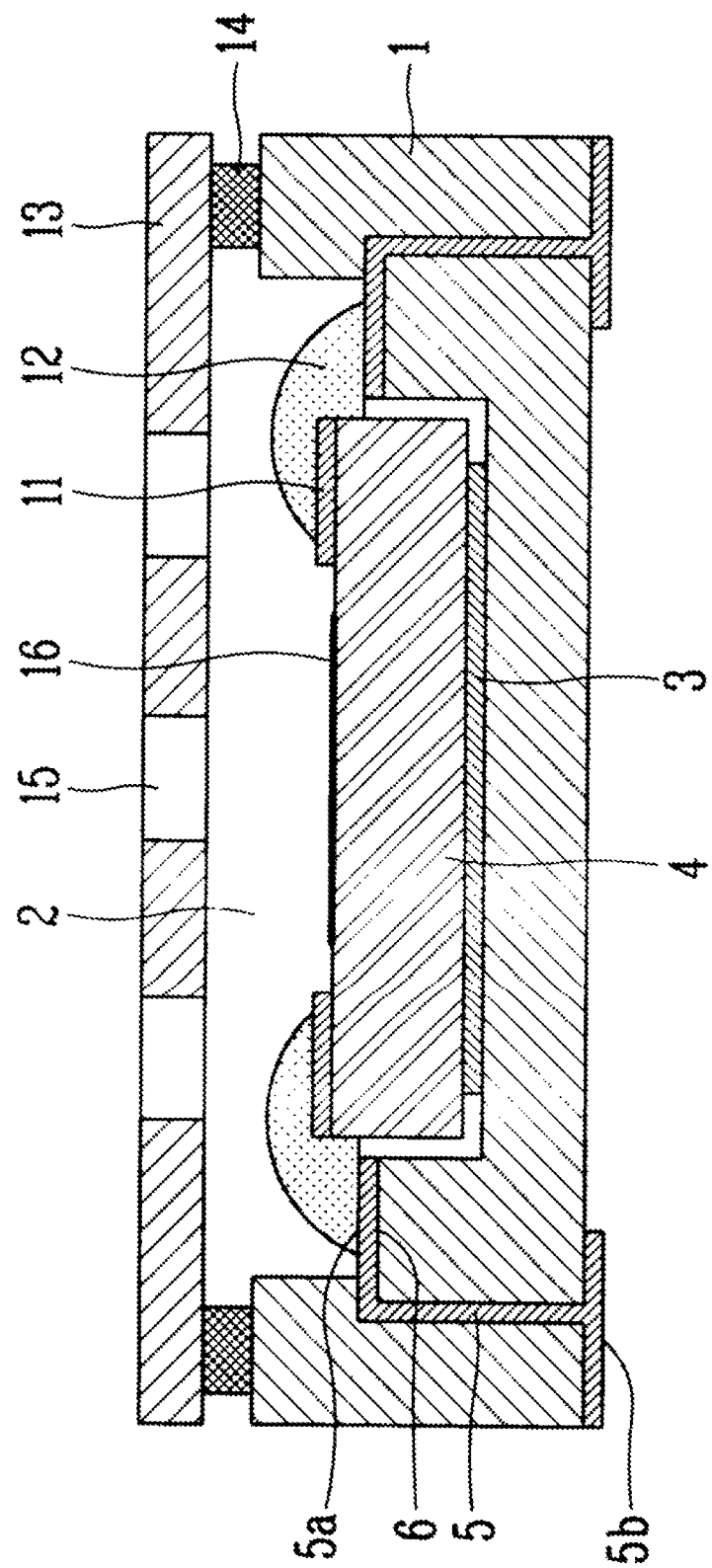
FIG. 1 is a longitudinal sectional view showing a conventional micro package for a gas sensor.
Figure 2:
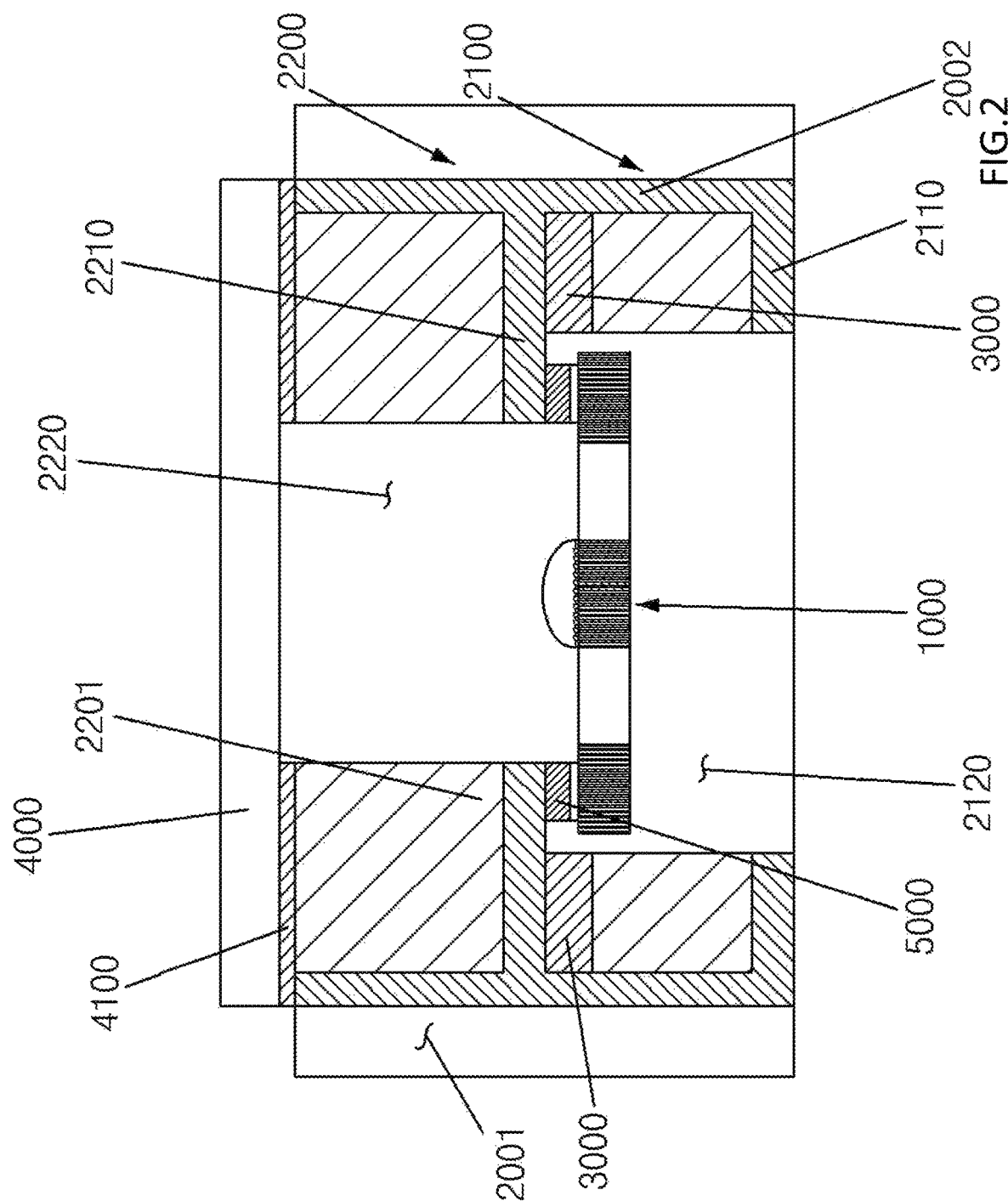
FIG. 2 is a sectional view showing a microsensor package according to an exemplary embodiment of the present invention.

Hereinbelow, exemplary embodiments of the present invention will be described in detail with reference to the accompanying drawings.

For reference, in the following description, the same configurations of the present invention as those of the related art will not be described in detail. Reference is made to the foregoing description of the related art.

When it is said that any part is positioned "on" another part, it means the part is directly on the other part or above the other part with at least one intermediate part. In contrast, if any part is said to be positioned "directly on" another part, it means that there is no intermediate part between the two parts.

Technical terms used here are to only describe a specific exemplary embodiment and are not intended to limit the present invention. Singular forms used here include a plurality of forms unless phrases explicitly represent an opposite meaning. A meaning of "comprising" used in a specification embodies a specific characteristic, area, integer, step, operation, element and/or component and does not exclude presence or addition of another specific characteristic, area, integer, step, operation, element, component and/or group.

Terms such as "lower" and "upper" representing relative space may be used for more easily describing a relationship to another portion of a portion shown in the drawings. Such terms are intended to include other meanings or operations of a using apparatus together with a meaning that is intended in the drawings. For example, when an apparatus is inverted in the drawings, any portion described as disposed at a "lower" portion of other portions is described as being disposed at an "upper" portion of other portions. Therefore, an illustrative term of "lower" includes entire upper and lower directions. An apparatus may rotate by 90° or another angle, and a term representing relative space is accordingly analyzed.

As shown in FIGS. 2 to 6, a microsensor package according to the embodiment includes: a sensing chip 1000; a first PCB 2100 provided with a first electrode layer 2110 patterned on a lower surface thereof, and provided with a first space 2120 having an open top; and a second PCB 2200 disposed at an upper portion of the first PCB 2100, provided with a second electrode layer 2210 patterned on a lower surface thereof, and provided with a second space 2220 penetrating vertically therethrough to stepwise communicate with the first space 2120, wherein the first electrode layer 2110 and the second electrode layer 2210 are electrically connected to each other, and the sensing chip 1000 is disposed in the first space 2120 and is electrically connected to the second electrode layer 2210.

The sensing chip 1000 includes a substrate 100, a sensor electrode 300 formed on the substrate 100, and a heater electrode 200 formed on the substrate 100.

When anodizing a metallic base material, an anodized film is formed. The anodized film is composed of a porous layer having a plurality of pores on the surface (upper surface) and a barrier layer existing at the lower portion of the porous layer. Here, the metallic base material may be aluminum (Al), titanium (Ti), tungsten (W), zinc (Zn), etc. It is preferred that the metallic base material be made of aluminum or an aluminum alloy material that is lightweight, is easy to process, is excellent in thermal conductivity, and obviates concern about heavy metal contamination.

For example, when anodizing the surface of aluminum, an alumina film is formed. The alumina film is composed of a porous alumina layer having a plurality of pores 102 penetrating the surface and a barrier layer existing at the lower portion of the porous alumina layer. According to the embodiment of the present invention, the substrate 100 may be, for example, an anodized film obtained by removing aluminum. Also, the electrode may be formed on the porous alumina layer of the alumina film, or may be formed on the barrier layer. Alternatively, the substrate 100 may be composed of only the porous alumina layer through which the pore 102 penetrates in a vertical direction by removing the barrier layer of the alumina film.

Hereinafter, the description is based on a substrate 100 where both the aluminum and the barrier layer are removed.

By removing the aluminum and the barrier layer from the anodized aluminum (AAO), the pores 102 of the substrate 100 vertically penetrate. The substrate 100 is composed of the porous alumina layer, whereby insulation performance is improved.

The diameter of the pore 102 is formed in nanometers.

The substrate 100 may be provided in the form of a quadrangular plate when viewed in a plan view.

The substrate 100 includes: a first supporting portion 110 formed at a center of the substrate 100; a second supporting unit 120 formed outside of the first supporting portion 110 being spaced apart from the first supporting portion 110; and a bridge portion connecting the first supporting portion 110 and the second supporting unit 120.

The first supporting portion 110 is provided in a cylindrical shape overall, with a plurality of bridge portions connected to the outer circumference thereof.

Further, in the substrate 100, a plurality of air gaps 101 is formed near the first supporting portion 110, namely, between the first supporting portion 110 and the second supporting unit 120.

The air gaps 101 are formed by vertically penetrating the substrate. In other words, the air gaps 101 are spaces formed by penetrating from an upper surface of the substrate 100 to a lower surface thereof.

The maximum width (lateral width) of the air gap 101 is wider than that of the pore 102, and than that of the sensor wire or a heating wire 210. The air gap 101 is formed in an arc shape, and is formed four in number. A plurality of air gaps 101 are arranged circumferentially spaced apart from each other.

A plurality of air gaps may be discontinuously formed. The air gaps 101 and the bridge portions are alternately placed around the first supporting portion 110. Accordingly, the first supporting portion 110 and the second supporting portion 120 are spaced apart from each other by the air gap 101 at a portion other than the bridge portion. The bridge portions are formed by discontinuously forming the air gaps 101 through etching the periphery of the first supporting portion 110. Thus, a first end of each bridge portion is connected to the first supporting portion 110, and a second end thereof is connected to the second supporting portion 120. The first supporting portion 110 and the second supporting portion 120 are connected to each other at four locations by four bridge portions.

The sensor electrode 300 is formed on the upper surface of the substrate 100.

The sensor electrode 300 detects the changes in the electrical characteristics when the gas is adsorbed onto the sensing material 600.

The sensor electrode 300 includes a first sensor electrode 300a and a second sensor electrode 300b spaced apart from the first sensor electrode 300a. The first sensor electrode 300a and the second sensor electrode 300b are spaced apart from each other, and are symmetrical based on the vertical center line on the plane.

Each of the first and second sensor electrodes 300a and 300b includes the sensor wire formed on the first supporting portion 110, and a sensor wire formed on both the bridge portion and the second supporting portion 120 by being connected to the sensor wire.

The first sensor electrode 300a includes a first sensor wire 310a formed on the upper surface of the first supporting portion 110, and a first sensor wire 320a connected to the first sensor wire 310a.

The second sensor electrode 300b includes a second sensor wire 310b formed on the upper surface of the first supporting portion 110, and a second sensor wire 320b connected to the second sensor wire 310b.

The sensor wire includes the first sensor wire 310a and the second sensor wire 310b. The sensor wire includes the first sensor wire 320a and the second sensor wire 320b. The width of the sensor wire is fixed. The sensor wire is placed on the upper surface of the bridge portion and the second supporting portion 120, and has the width wider than the widths of the first sensor wire 310a and the second sensor wire 310b. The widths of the sensor wires of the first and the second sensor electrodes 300a and 300b are wider towards the end portions. That is, the widths of the sensor wires are gradually reduced towards the first sensor wire 310a and the second sensor wire 310b.

The sensor electrode 300 is formed of a mixture including one of or at least one of Pt, W, Co, Ni, Au, and Cu.

A heater electrode 200 is formed on the upper surface of the substrate 100.

The pore 102 placed at the lower portion of the heater electrode 200 and the sensor electrode 300 has the blocked upper portion and the opened lower portion.

The heater electrode 200 includes: a heating wire 210 closer to a sensor wire than to a sensor wire by being formed on the first supporting portion 110; and a heater electrode pad formed on the second supporting portion 120 and the bridge portion by being connected to the heating wire 210.

The heating wire 210 is formed on the first supporting portion 110, and surrounds at least a part of the first sensor wire 310a and the second sensor wire 310b. The heater electrode pad includes a first heater electrode pad 220a and a second heater electrode pad 220b spaced apart from each other by respectively being connected to both ends of the heating wire 210.

When viewed in a plan view, the heating wire 210 is formed to be symmetrical about the vertical center line of the first supporting portion 110, and includes a plurality of arc portions formed in arc shapes and a plurality of connecting portions connecting the arc portions.

Figure 3:
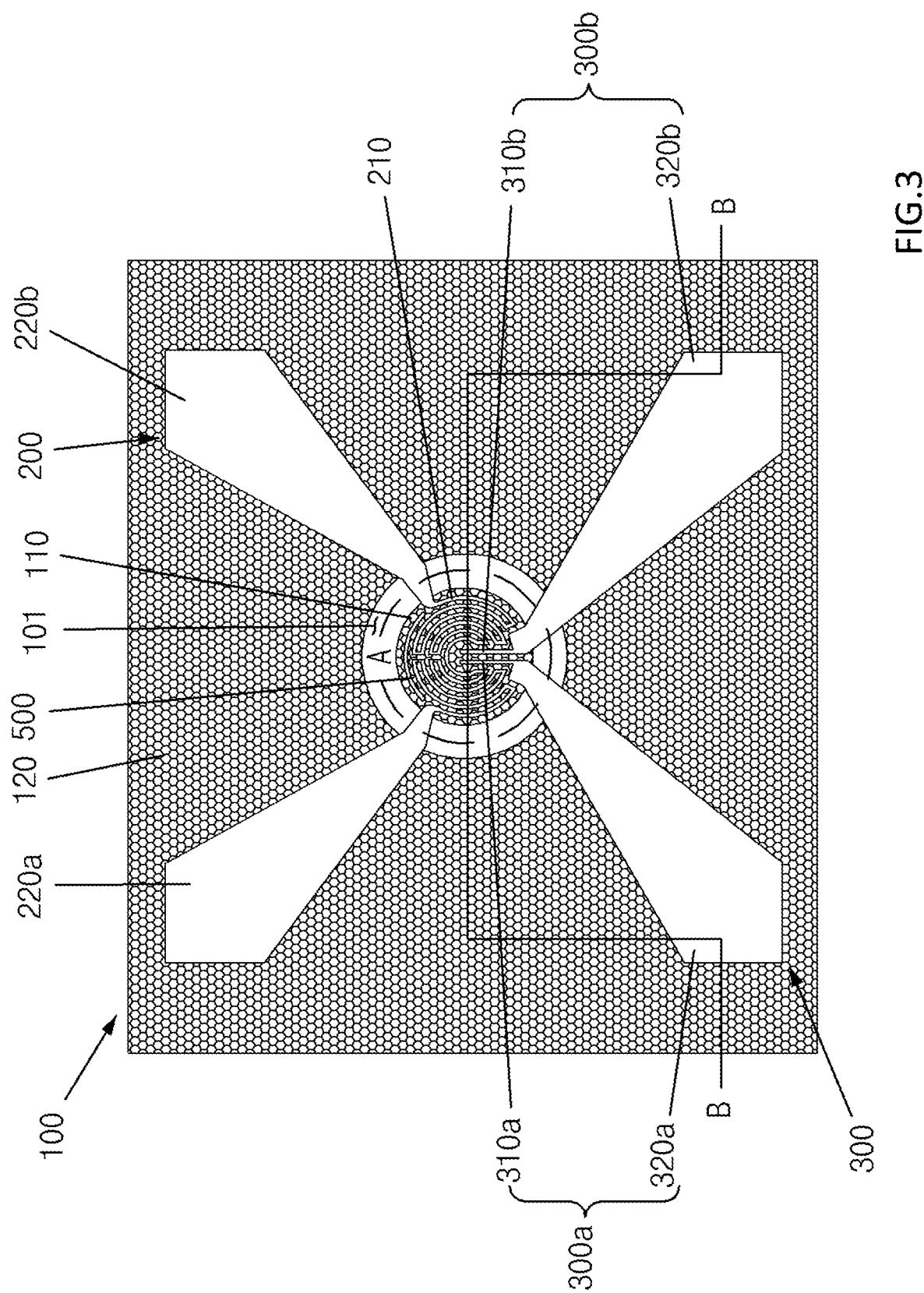
FIG. 3 is a plan view showing a sensing chip of the microsensor package of FIG. 2.
Figure 4:
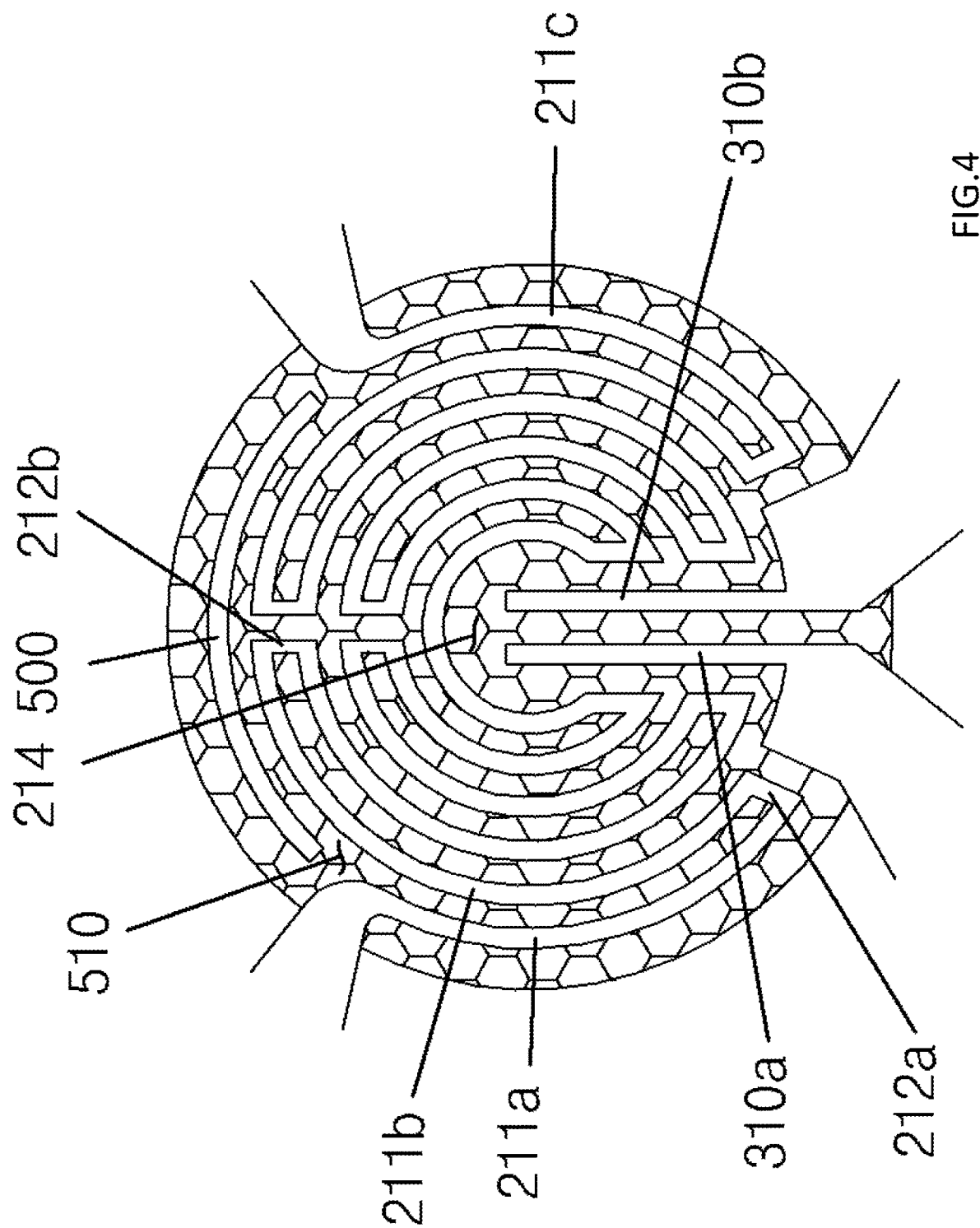
FIG. 4 is an enlarged view of A portion of FIG. 3.
Figure 5:
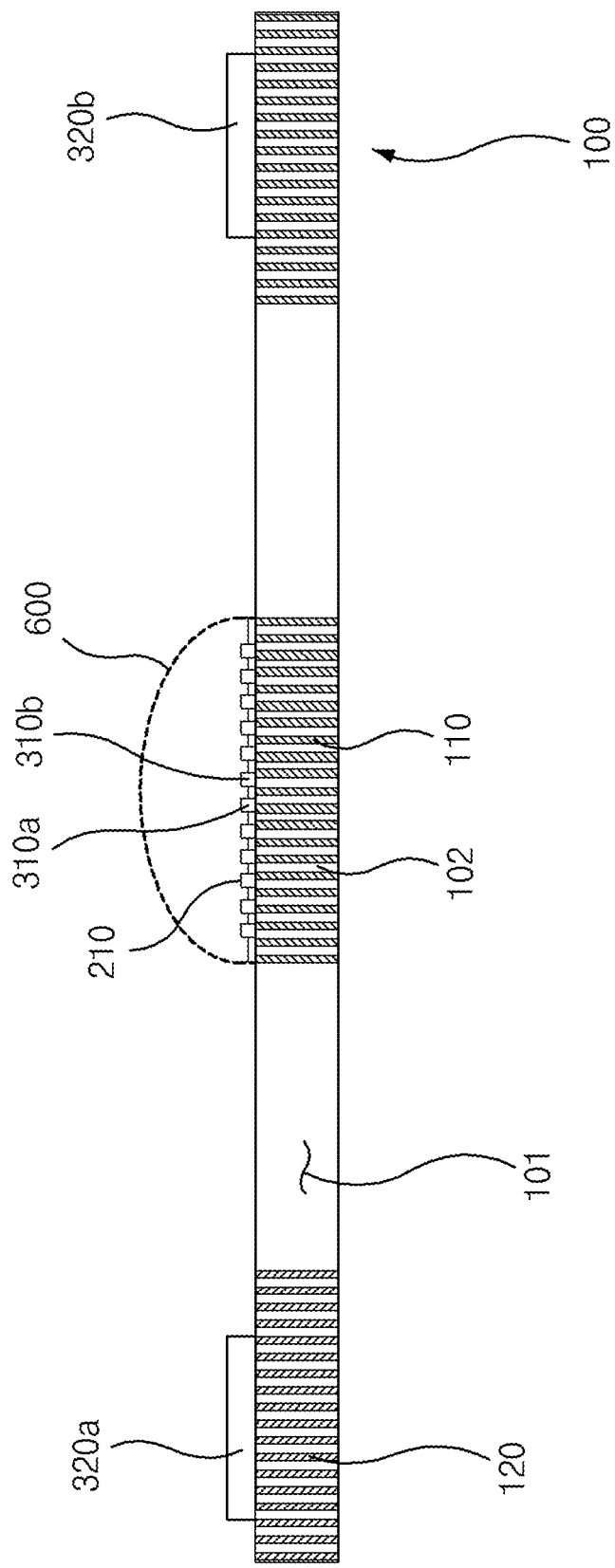
FIG. 5 is an enlarged view taken along line B-B of FIG. 3.

As shown in FIG. 3, the heating wire 210 includes: a first arc portion 211a formed in an arc shape close to the air gap 101; a first connecting portion 212a extending from an end of the first arc portion 211a and bent toward the inside of the first supporting portion 110; a second arc portion 211b in an arc shape extending from an end of the first connecting portion 212a and spaced apart from the first arc portion 211a inwards; a second connecting portion 212b extending from an end of the second arc portion 211b toward the inside of the first supporting portion 110; and a third arc portion 211c. In this manner, a plurality of arc portions and connecting portions are formed by being repeatedly connected to each other.

The heating wire 210 is connected from the first arc portion 211a to the third arc portion 211c to have an integral body.

A plurality of arc portions of the heating wire 210 is formed in a half-arc shape. Thus, the heating wire 1210 is overall in a circular shape. Accordingly, temperature uniformity of the first supporting portion 110 and the sensing material 600 may be enhanced.

The central portion of the heating wire 210 is a point where opposite arc portions meet, and the central point is in a left side opened circular shape by joining two arc portions in arc shapes together. An isolated space portion 214 is formed inside of the central portion. The isolated space portion 214 is formed by extending from central portions of the first supporting portion 110 and the heating wire 210 to the outermost of the first supporting portion 110 and the heating wire 210. The sensor wire is placed at the isolated space portion 214. Further, a second end portion of the first arc portion 211a is connected to the first heater electrode pad 220a, and a first end portion of the third arc portion 211c is connected to the second heater electrode pad 220b.

The heater electrode 200 is formed of a mixture including one or at least one of Pt, W, Co, Ni, Au, and Cu.

In the meantime, a dummy metal 500 is formed between both ends of the heating wire 210, namely, the ends of the first arc portion 211a and the third arc portion 211c respectively connected to the first heater electrode pad 220a and the second heater electrode pad 220b. The dummy metal 500 is formed on the upper surface of the first supporting portion 110.

The dummy metal 500 is formed in an arc shape between the air gap 101 and the heating wire 210 of the heater electrode 200. The dummy metal 500 is spaced apart from the heating wire 210 adjacent thereto.

It is desired that the dummy metal 500 is formed outside of the heating wire 210 and is a metal. The material of the dummy metal 500 may be the same as the electrode material, and the electrode material may be a metal such as platinum, aluminum, copper, etc.

The central angles of the first arc portion 211a and the third arc portion 211c are small, compared to the remaining arc portions placed inside thereof. At the outer circumference of the heating wire 210, a space 510 is defined between the ends of the first arc portion 211a and the third arc portion 211c. The dummy metal 500 is placed at the space 510.

The space 510 at the outer circumference of the heating wire 210 is partially filled by the area of the dummy metal 500. Thus, when viewed in a plan view, the outer circumference of the heating wire 210 and the dummy metal 500 is in a circular shape, whereby temperature uniformity of the first supporting portion 110 may be enhanced. Accordingly, temperature distribution of the heating wire 210, which is heated by low power, on the first supporting portion 110 is more uniform.

The heater electrode pad includes the first and the second heater electrode pads 220a and 220b that are respectively connected to both ends of the heating wire 210. As described above, at least two heater electrode pads are formed. The widths of the heater electrode pads are wider towards the outside. In other words, the widths of the heater electrode pads are narrower towards the heating wire 210. The width of the heater electrode pad is wider than the width of the heating wire 210.

The heater electrode pad and the sensor wire are placed in radial directions with respect to the first supporting portion 110. The end portions of both the heater electrode pad and a sensor electrode pad are arranged close to each corner of the substrate 100 and are spaced apart from each other.

In other words, the heater electrode pads are disposed on the left and right sides of the heating wire 210 respectively, and the sensor electrode pads are disposed on the left and right sides of the sensor wire respectively.

An anti-discoloration protective layer (not shown) is formed on a part of an upper portion of the heater electrode 200 and the sensor electrode 300. The anti-discoloration protective layer may be formed of oxide type material. Moreover, the anti-discoloration protective layer may be formed of at least one of tantalum oxide (TaOx), titanium oxide (TiO$_2$), silicon oxide (SiO$_2$), and aluminum oxide (Al$_2$O$_3$).

The heating wire 210 and the first and the second sensor wires 310a and 310b are surrounded by the air gap 101. In other words, the air gap 101 is placed around the heating wire 210 and the first and the second sensor wires 310a and 310b. The air gap 101 is placed at the sides of the heating wire 210 and the first and the second sensor wires 310a and 310b.

Specifically, the air gaps 101 are placed between the first heater electrode pad 220a and the first sensor wire 320a of the first sensor electrode 300a, between the first heater electrode pad 220a and the second heater electrode pad 220b, between the second heater electrode pad 220b and the second sensor wire 320b of the second sensor electrode 300b, and between the second sensor wire 320b of the second sensor electrode 300b and the first sensor wire 320a of the first sensor electrode 300a. In other words, the air gaps 101 are formed at an area except for the portion supporting the heater electrode 200 and the sensor electrode 300.

Due to the air gap 101, on the substrate 100, formed are the first supporting portion 110 supporting the heating wire 210 and the sensor wire in common; and the second supporting portion 120 and the bridge portion that supports the heater electrode pad and the sensor wire.

The area of the first supporting portion 110 is wider than the area of the heating wire 210 and the sensor wire.

On the first supporting portion 110, a sensing material 600 is formed to cover the heating wire 210 and the sensor wire. That is, the sensing material 600 is formed at a position corresponding to the first supporting portion 110. The sensing material 600 is formed by being printed. When the sensing material 600 is printed, the print in a mesh-net shape remains on the surface of the sensing material 600 after forming the sensing material 600.

The first PCB 2100 is in the form of a plate, and provided with the first electrode layer 2110 patterned on a lower surface thereof. The first electrode layer 2110 may be formed to correspond to locations of the sensor electrode pad and the heater electrode pad. The first electrode layer 2110 is arranged in the left-right direction.

The first PCB 2100 may be in the form of a rigid PCB.

The first PCB 2100 is formed with a first space 2120 such that an upper portion thereof is open. In the embodiment, the first space 2120 is formed to vertically penetrate. Alternatively, the first space may be formed such that the upper portion thereof is open and the lower portion thereof is blocked.

A lateral width of the first space 2120 is larger than that of the sensing chip 1000, and a vertical width of the first space 2120 is larger than that of the sensing chip 1000. Accordingly, the lower portion of the sensing chip 1000 is disposed to be spaced apart from the upper portion of the PCB to which the microsensor package is mounted. Thereby, insulation performance of sensing chip 1000 may be improved.

The first electrode layer 2110 is disposed around the first space 2120. The first electrode layer 2110 is disposed at left and right sides of the first space 2120, respectively. Further, the inner and outer sides of the first electrode layer 2110 are exposed through the first space 2120 and the outer side of the microsensor package.

The second PCB 2200 is in the form of a plate, and disposed at the upper portion of the first PCB 2100. The lower portion of the second PCB 2200 is attached to the upper surface of the first PCB 2100 through the adhesive layer 3000. The second PCB 2200 and the first PCB 2100 are aligned and attached.

Further, the second PCB 2200 is in the form of a flexible PCB, whereby it is possible to reduce a thickness of the package. A vertical thickness of the second PCB 2200 may be smaller than that of the first PCB 2100.

The second PCB 2200, like the first PCB 2100, is also provided with a second electrode layer 2210 on a lower surface thereof. The second electrode layer 2210 may also be formed to correspond to locations of the sensor electrode pad and the heater electrode pad. The second electrode layer 2210 is arranged in the left-right direction.

Accordingly, the second electrode layer 2210 is disposed between the first PCB 2100 and the second PCB 2200.

A second space 2220 is formed vertically through the second PCB 2200.

The second electrode layer 2210 is around the second space 2220. The second electrode layer 2210 is disposed at left and right sides of the second space 2220, respectively.

The second space 2220 is formed to stepwise communicate with the first space 2120. A lateral width of the second space 2220 is smaller than that of the first space 2120, so as to be stepwise.

Accordingly, the second PCB 2200 is formed with a stepped portion 2201 inwardly protruding more than inner wall of the first PCB 2100.

The lower portion of the second electrode layer 2210 disposed at the lower portion of the stepped portion 2201 is exposed to the outside through the first space 2120. In other words, the second electrode layer 2210 formed at the lower portion of the stepped portion 2201 is disposed at the upper portion of the first space 2120.

The inner and outer sides of second electrode layer 2210 are exposed through the second space 2220 and the outer side of the microsensor package.

The sensing chip 1000 is disposed in the first space 2120, the sensor electrode pad and the heater electrode pad of the sensing chip 1000 are electrically connected to the exposed portion of the lower portion of the second electrode layer 2210, respectively. In other words, the sensing chip 1000 is connected to the lower portion of the stepped portion 2201.

The air gaps 101 and the pores 102 of the sensing chip 1000 communicate with the first and second spaces 2120 and 2220.

The sensor electrode pad and the heater electrode pad of the sensing chip 1000 and the second electrode layer 2210 are connected through a chip bonding layer 5000. The chip bonding layer 5000 is applied with an Ag epoxy as a thermosetting material, or applied with a solder with a melting temperature different from a solder used to bond the microsensor package to an associated PCB.

Thereby, it is possible to prevent the chip bonding layer 5000 from being remelted when bonding the microsensor package to the associated PCB, thereby preventing separation, and it is possible to secure excellent conductivity.

The second PCB 2200 is provided with a planar AAO filter 4000 at an upper surface thereof through a filter adhesive layer 4100.

Accordingly, the upper portion of the second space 2220 is covered with the AAO filter 4000. Accordingly, gas is supplied to the second space 2220 and to the sensing chip 1000 after passing through the AAO filter 4000.

The AAO filter 4000 is formed with a plurality of nano-sized pores penetrating vertically therethrough. The pores of the AAO filter 4000 communicate with the second space 2220. Accordingly, it is possible to effectively prevent foreign matter from being introduced into the gas sensing portion.

Further, the inside of the pores of the AAO filter 4000 is subjected to hydrophobic surface treatment, whereby it is possible to prevent moisture penetration into the gas sensing portion.

Both the first and second PCBs 2100 and 2200 are formed with a third space 2001 penetrating vertically therethrough. Accordingly, upper and lower portions of the third space 2001 are open. Alternatively, the third space may be formed only in the first PCB by penetrating vertically therethrough, such that the first electrode layer and the second electrode layer are connected. In this case, the upper portion of the third space is blocked by the second PCB.

The third space 2001 is formed at opposite sides of the first and second spaces 2120 and 2220, respectively. In other words, the third space 2001 is disposed at outer sides of the first and second spaces 2120 and 2220, respectively.

The third space 2001 is configured such that an outer side thereof is open. When viewed in a plan view, the third space 2001 is formed to be concave inwardly.

In the third space 2001, a connecting portion 2002 is formed in a vertical direction to electrically connect the first electrode layer 2110 and the second electrode layer 2210 to each other. The connecting portion 2002 is formed at outer sides of the first PCB 2100, the adhesive layer 3000, and the second PCB 2200. The connecting portion 2002 is exposed to the outer sides of the first PCB 2100, the adhesive layer 3000, and the second PCB 2200 through the open side portion of the third space 2001. Alternatively, in the case where a side of the third space is configured not to be exposed, the connecting portion is also formed not to be exposed to outer sides of the first and second PCBs, and the adhesive layer.

The connecting portion 2002 is formed in the third space 2001, whereby it is possible to protect the connecting portion 2002.

The connecting portion 2002 is formed along the inner wall of the third space 2001. Accordingly, when viewed in a plan view, the connecting portion 2002 is formed to be concave inwardly.

Hereinafter, the operation of the embodiment having the above-described configuration will be described.

In order to measure the gas concentration, first, the same electric power is applied to two heater electrode pads 220 of the heater electrode 200 so as to heat the sensing material 600 to a predetermined temperature.

The gas inside the second space 2220 is adsorbed onto or desorbed from the heated sensing material 600.

Accordingly, electrical conductivity between the first sensor wire 310*a* and the second sensor wire 310*b* changes, thereby detecting gas.

Further, for more precise measurement, target gas concentration is measured after resetting the sensing material 600 to its initial state through high temperature heating, thereby forcibly removing gas species or moisture being already adsorbed onto the sensing material 600.

A manufacturing method for a microsensor package according to the embodiment is as follows.

Figure 6:
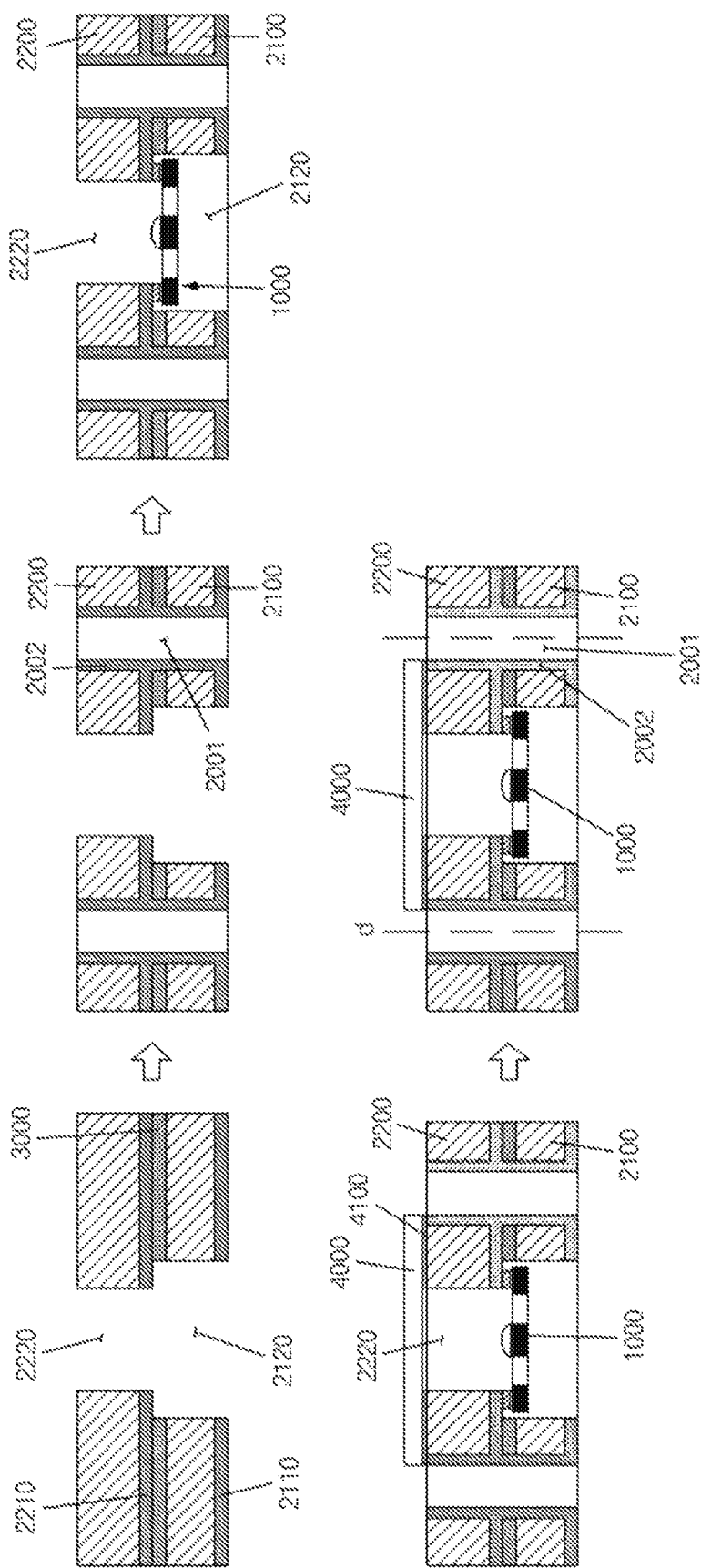
FIG. 6 is a sectional view showing a state where a plurality of microsensor packages according to an exemplary embodiment of the present invention is manufactured simultaneously.

As shown in FIG. 6, the manufacturing method includes: preparing the first PCB 2100 provided with the first electrode layer 2110 patterned on the lower surface thereof and the first space 2120 penetrating vertically therethrough, and the second PCB 2200 provided with the second electrode layer 2210 patterned on the lower surface thereof and the second space 2220 penetrating vertically therethrough; bonding the second PCB 2200 to the upper portion of the first PCB 2100 such that the first space 2120 and the second space 2220 stepwise communicate with each other; and electrically connecting the sensing chip 1000 to the second electrode layer 2210 after disposing the sensing chip 1000 in the first space 2120.

Hereinbelow, a method of manufacturing a plurality of microsensor packages simultaneously will be exemplarily described.

The first PCB 2100 and the second PCB 2200 have a planar shape similar to each other.

In the first PCB 2100, a plurality of first spaces 2120 are formed to be spaced apart from each other in the left-right direction, and in the second PCB 2200, a plurality of second spaces 2220 are formed to be spaced apart from each other in the left-right direction.

The lateral width of the first space 2120 is larger than that of the second space 2220.

In the bonding step, the second PCB 2200 is disposed above the first PCB 2100, and the adhesive layer 3000 is disposed between the first PCB 2100 and the second PCB 2200, thereby bonding the first PCB 2100 and the second PCB 2200 together.

When bonding, the first space 2120 and the second space 2220 are aligned to stepwise communicate with each other.

After the bonding step, the first electrode layer 2110 and the second electrode layer 2210 are connected to each other.

In the connection step, firstly, both the first PCB 2100 and the second PCB 2200 are formed with the third space 2001 penetrating vertically therethrough. Accordingly, the third space 2001 also penetrates the first electrode layer 2110 and the second electrode layer 2210. Thereby, sides of the first electrode layer 2110 and the second electrode layer 2210 are exposed through the third space 2001.

The third space 2001 is formed at opposite sides of the first and second spaces 2120 and 2220, respectively. As in the embodiment, in the case where a plurality of first and second spaces 2120 and 2220 are formed, the third space 2001 is disposed between two neighboring first and second spaces 2120 and 2220.

Next, the connecting portion 2002 is formed on the inside of the third space 2001 through plating or the like. The connecting portion 2002 is formed along an inner wall of the third space 2001 to be formed in a hollow columnar shape. In other words, the connecting portion 2002 is formed throughout the inner wall of the third space 2001. The sides of the first electrode layer 2110 and the second electrode layer 2210 exposed through the third space 2001 are connected through the connecting portion 2002.

Next, the sensing chip 1000 is inserted through the lower portion of the first space 2120 to be disposed in the first space 2120. Thereby, the sensing material 600 is exposed through the second space 2220. In other words, the sensing material 600 that is a portion sensing gas is disposed in the second space 2220 in the sensing chip 1000.

The sensing chip 1000 is electrically connected to the second electrode layer 2210 through the chip bonding layer 5000. Thereby, the first space 2120 serves as a space for receiving the sensing chip 1000, and second space 2220 serves as a gas inflow passage.

Alternatively, in the case where the upper portion of the first space is open and the lower portion thereof is blocked, the microsensor package may be manufactured in such a manner that the sensing chip is electrically connected to the second electrode layer of the second PCB formed with the second space, then the second PCB is attached onto the first PCB, and then the connecting portion is formed.

Since the sensing chip 1000 is disposed to the first and second spaces 2120 and 2220, respectively, a plurality of sensing chips 1000 are electrically connected to the second PCB 2200.

The third space 2001 is disposed between two neighboring sensing chips 1000.

After the chip connection step, the method further includes a step of bonding a filter such as the AAO filter 4000 to the upper portion of the second PCB 2200. The filter is provided to block the second space 2220. The filter may be configured such that a lateral length thereof is shorter than a distance between the two third spaces 2001 disposed at opposite sides of the sensing chip 1000, or may be configured to have an area sufficient to cover the entire upper surface of the second PCB 2200. When the filter has the sufficient area, after bonding the filter, individualization is possible by etching a cutting line d, which will be described hereinbelow.

The first PCB 2100 and second PCB 2200 are separated along the third space 2001 such that the cutting line d passes through a cavity of the connecting portion 2002. For example, the cutting line d is formed along a central line between the connecting portion 2002 and the third space 2001 arranged vertically on a plane. In other words, the cutting line d is disposed between the right side and the left side of the connecting portion 2002.

Through this cutting step, one connecting portion 2002 is divided into two, and the two neighboring sensing chips 1000 are separated.

As described above, it is possible to manufacture a plurality of unit packages by a simple breaking or a cutting process.

As described above, although the exemplary embodiments of the present invention have been disclosed, those skilled in the art will appreciate that various modifications or changes are possible, without departing from the scope and spirit of the invention as disclosed in the accompanying claims.

What is claimed is:

1. A microsensor package comprising:
    a sensing chip;
    a first PCB provided with a first electrode layer patterned on a lower surface thereof, and provided with a first space having an open top; and
    a second PCB disposed at an upper portion of the first PCB, provided with a second electrode layer patterned on a lower surface thereof, and provided with a second space penetrating vertically therethrough to stepwise communicate with the first space,
    wherein the first electrode layer and the second electrode layer are electrically connected to each other, and
    the sensing chip is disposed in the first space and is electrically connected to the second electrode layer.

2. The microsensor package of claim 1, wherein the first PCB and the second PCB are attached to each other by an adhesive layer.

3. The microsensor package of claim 1, wherein an upper portion of the second space is covered with an AAO filter.

4. The microsensor package of claim 3, wherein the AAO filter is subjected to hydrophobic surface treatment.

5. The microsensor package of claim 1, wherein the first PCB is provided with a third space penetrating vertically therethrough, and
    the third space is provided therein with a connecting portion electrically connecting the first electrode layer and the second electrode layer to each other.

6. The microsensor package of claim 5, wherein the third space is configured to be open at an outer side thereof.

7. The microsensor package of claim 1, wherein the second PCB is in a form of a flexible PCB.

8. The microsensor package of claim 1, wherein the sensing chip and the second electrode layer are electrically connected to each other via an Ag epoxy or a solder.

9. The microsensor package of claim 1, wherein the first space penetrates vertically through the first PCB.

10. A manufacturing method for a microsensor package, the manufacturing method comprising:
    preparing a first PCB provided with a first electrode layer patterned on a lower surface thereof and a first space penetrating vertically therethrough, and a second PCB provided with a second electrode layer patterned on a lower surface thereof and a second space penetrating vertically therethrough;
    bonding the second PCB to an upper portion of the first PCB such that the first space and the second space stepwise communicate with each other; and
    electrically connecting the sensing chip to the second electrode layer after disposing the sensing chip in the first space.

11. The manufacturing method of claim 10, further comprising:
    connecting the first electrode layer and the second electrode layer to each other after the bonding the second PCB.

12. The manufacturing method of claim 11, wherein in the electrically connecting the sensing chip, the first PCB is provided with a third space penetrating vertically therethrough, and
    the third space is provided therein with a connecting portion connecting the first electrode layer and the second electrode layer to each other.

13. The manufacturing method of claim 12, wherein the third space penetrates through both the first PCB and the second PCB,
    in the electrically connecting the sensing chip, the connecting portion is provided along an inner wall of the third space to be formed in a hollow columnar shape,
    the first space is provided in the first PCB in plural,
    the second space is provided in the second PCB in plural,
    the sensing chip is connected to the second PCB in plural,
    the third space is disposed between neighboring sensing chips, and
    the manufacturing method further comprises separating the first PCB and the second PCB along the third space after the electrically connecting the sensing chip.

* * * * *